(12) United States Patent
Wang et al.

(10) Patent No.: US 10,937,845 B2
(45) Date of Patent: Mar. 2, 2021

(54) DISPLAY SUBSTRATE AND METHOD FOR MANUFACTURING THE SAME, DISPLAY PANEL AND METHOD FOR MANUFACTURING THE SAME, AND DISPLAY DEVICE

(71) Applicant: BOE Technology Group Co., Ltd., Beijing (CN)

(72) Inventors: Hejin Wang, Beijing (CN); Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/538,930

(22) Filed: Aug. 13, 2019

(65) Prior Publication Data
US 2020/0058718 A1 Feb. 20, 2020

(30) Foreign Application Priority Data
Aug. 15, 2018 (CN) .......................... 201810928917.6

(51) Int. Cl.
*H01L 27/32* (2006.01)
*H01L 51/52* (2006.01)
(Continued)

(52) U.S. Cl.
CPC ...... *H01L 27/3246* (2013.01); *H01L 27/3272* (2013.01); *H01L 51/0096* (2013.01);
(Continued)

(58) Field of Classification Search
CPC . H01L 2224/16225; H01L 2224/73204; H01L 51/5246; H01L 27/3246;
(Continued)

(56) References Cited

U.S. PATENT DOCUMENTS

2003/0010892 A1* 1/2003 Clark .................... H01L 27/146
  250/208.1
2004/0201582 A1* 10/2004 Mizukoshi ........... G09G 3/3291
  345/211

(Continued)

FOREIGN PATENT DOCUMENTS

CN        107977632 A        5/2018

OTHER PUBLICATIONS

Office Action dated Mar. 13, 2020 issued in corresponding Chinese Application No. 201810928917.6.

*Primary Examiner* — Caridad Everhart
(74) *Attorney, Agent, or Firm* — Nath, Goldberg & Meyer; Joshua B. Goldberg

(57) ABSTRACT

The present disclosure provides a display substrate, which includes a base substrate and a light emitting element layer, which is on a side of the base substrate and includes a pixel defining layer and a plurality of light emitting elements. The pixel defining layer includes a plurality of pixel openings and a plurality of light transmission holes, and the plurality of light emitting elements are in the plurality of pixel openings, respectively. Each of the plurality of light transmission holes penetrates through the pixel defining layer in a thickness direction of the pixel defining layer. Portions of the pixel defining layer not provided with the plurality of pixel openings or the plurality of light transmission holes are opaque light shields, and a portion of the display substrate overlapping each of the plurality of light transmission holes in the thickness direction is light transmissive.

20 Claims, 3 Drawing Sheets

(51) Int. Cl.
*H01L 51/56* (2006.01)
*H01L 51/00* (2006.01)

(52) U.S. Cl.
CPC ...... *H01L 51/5218* (2013.01); *H01L 51/5253* (2013.01); *H01L 51/5284* (2013.01); *H01L 51/56* (2013.01); *H01L 2227/323* (2013.01); *H01L 2251/301* (2013.01); *H01L 2251/308* (2013.01); *H01L 2251/5315* (2013.01)

(58) Field of Classification Search
CPC ............ H01L 27/4372; H01L 27/3227; H01L 27/326; H01L 27/3234; H01L 51/5253; H01L 51/0096; H01L 51/5218; H01L 51/56; H01L 2227/323; H01L 2251/308; H01L 2251/5315

See application file for complete search history.

(56) References Cited

U.S. PATENT DOCUMENTS

| | | | |
|---|---|---|---|
| 2007/0077349 A1* | 4/2007 | Newman | B82Y 20/00 427/66 |
| 2015/0112826 A1* | 4/2015 | Crutchfield, Jr. | G06Q 30/0601 705/26.1 |
| 2016/0197126 A1* | 7/2016 | Yoo | H01L 27/3288 257/40 |
| 2016/0254496 A1 | 9/2016 | Xu et al. | |
| 2017/0229529 A1* | 8/2017 | Jung | H01L 27/326 |
| 2019/0172887 A1 | 6/2019 | Sun et al. | |

* cited by examiner

DISPLAY SUBSTRATE AND METHOD FOR MANUFACTURING THE SAME, DISPLAY PANEL AND METHOD FOR MANUFACTURING THE SAME, AND DISPLAY DEVICE

CROSS-REFERENCE TO RELATED APPLICATIONS

The present application claims the priority of Chinese Patent Application No. 201810928917.6, filed on Aug. 15, 2018, the contents of which are incorporated herein in their entirety by reference.

TECHNICAL FIELD

The present disclosure relates to the field of display technology, and in particular, relates to a display substrate, a method for manufacturing a display substrate, a display panel, a method for manufacturing a display panel, and a display device.

BACKGROUND

With the development of technology, a display device can capture an image (e.g., a photograph) of a user of the display device while performing a communication, and then transmit the image to another user over a network. Therefore, it is desirable to ensure that the captured image is not distorted while ensuring the effect of video communication.

SUMMARY

Embodiments of the present disclosure provide a display substrate, a method for manufacturing a display substrate, a display panel, a method for manufacturing a display panel, and a display device including the display panel.

An aspect of the present disclosure provides a display substrate, including
a base substrate; and
a light emitting element layer, which is on a side of the base substrate, and includes a pixel defining layer and a plurality of light emitting elements,
wherein the pixel defining layer includes a plurality of pixel openings and a plurality of light transmission holes, the plurality of light emitting elements are in the plurality of pixel openings, respectively, each of the plurality of light transmission holes penetrates through the pixel defining layer in a thickness direction of the pixel defining layer, portions of the pixel defining layer not provided with the plurality of pixel openings or the plurality of light transmission holes are opaque light shields, and a portion of the display substrate overlapping each of the plurality of light transmission holes in the thickness direction is light transmissive.

In an embodiment, the display substrate further includes a driving layer between the base substrate and the light emitting element layer, wherein the driving layer includes a plurality of pixel circuits in one-to-one correspondence with the plurality of light emitting elements, and a portion of the driving layer overlapping each of the plurality of light transmission holes in the thickness direction is light transmissive.

In an embodiment, each of the light shields of the pixel defining layer is made of a material including a polymer and a colored dye.

In an embodiment, the polymer includes at least one of polyimide and acrylic.

In an embodiment, the colored dye includes a black dye.

In an embodiment, the black dye includes carbon black.

In an embodiment, each of the plurality of pixel circuits includes a thin film transistor.

In an embodiment, each of the plurality of light emitting elements includes an anode and a light emitting function layer, and the anode is between the light emitting function layer and the driving layer.

In an embodiment, the anode is a reflective anode, and is configured to reflect light emitted from the light emitting function layer towards a direction away from the driving layer.

In an embodiment, the anode has a multilayer structure of ITO/Ag/ITO.

In an embodiment, the base substrate is made of a transparent material.

In an embodiment, the base substrate is made of at least one of glass and a resin.

Another aspect of the present disclosure provides a display panel, including
a display substrate; and
a package structure,
wherein the display substrate is the display substrate according to any one of the above embodiments of the present disclosure, and
the package structure is on a side of the display substrate distal to the base substrate, to package the display substrate.

Still another aspect of the present disclosure provides a display device, including
a photosensitive unit; and
a display panel,
wherein the display panel is the display panel according to the embodiment of the present disclosure, and
the photosensitive unit is on a side of the base substrate distal to the light emitting element layer, such that light propagating from a light emitting side of the display panel to the display panel passes through the plurality of light transmission holes to arrive at the photosensitive unit.

Yet another aspect of the present disclosure provides a method for manufacturing a display substrate, including steps of
forming a base substrate; and
forming a light emitting element layer on the base substrate, wherein the light emitting element layer includes a pixel defining layer and a plurality of light emitting elements,
wherein the pixel defining layer includes a plurality of pixel openings and a plurality of light transmission holes, the plurality of light emitting elements are provided in the plurality of pixel openings, respectively, each of the plurality of light transmission holes penetrates through the pixel defining layer in a thickness direction of the pixel defining layer, portions of the pixel defining layer not provided with the plurality of pixel openings or the plurality of light transmission holes are opaque light shields, and a portion of the display substrate overlapping each of the plurality of light transmission holes in the thickness direction is light transmissive.

In an embodiment, the step of forming a light emitting element layer includes steps of
forming a plurality of anodes on the base substrate;
forming a pixel defining material layer on the base substrate and the plurality of anodes;
forming the plurality of pixel openings and the plurality of light transmission holes in the pixel defining material layer, wherein the plurality of pixel openings expose the plurality of anodes, respectively, and the plurality of light transmission holes separate the plurality of pixel openings from each other, respectively; and forming a light emitting function layer in each of the plurality of pixel openings, such that the anode and the light emitting function layer in a same one of the plurality of pixel openings form one of the plurality of light emitting elements.

In an embodiment, the method further includes, between the step of forming a base substrate and the step of forming a light emitting element layer, a step of forming a driving layer on the base substrate, wherein the driving layer includes a plurality of pixel circuits in one-to-one correspondence with the plurality of light emitting elements, and a portion of the driving layer overlapping each of the plurality of light transmission holes in the thickness direction is light transmissive.

In an embodiment, the step of forming a pixel defining material layer includes steps of forming the pixel defining material layer by using an opaque material, wherein the opaque material includes a polymer and a colored dye, and the polymer includes at least one of polyimide and acrylic; and patterning the pixel defining material layer, to form the pixel defining layer.

In an embodiment, carbon black is employed as the colored dye.

Still another aspect of the present disclosure provides a method for manufacturing a display panel, including steps of manufacturing a display substrate by using the method for manufacturing a display substrate according to any one of the above embodiments of the present disclosure; and packaging the display substrate by using a package structure, wherein the package structure is provided on a side of the display substrate distal to the base substrate.

BRIEF DESCRIPTION OF THE DRAWINGS

The accompanying drawings, which constitute a part of the specification, are provided for better understanding of the present disclosure, and for the purpose of explaining the present disclosure together with the following exemplary embodiments, but are not intended to limit the present disclosure, wherein.

DETAILED DESCRIPTION

Exemplary embodiments of the present disclosure will be described in detail below with reference to the accompanying drawings. It should be noted that, the exemplary embodiments described herein are only for the purpose of explaining and illustrating the present disclosure, but are not intended to limit the present disclosure.

The inventors of the present inventive concept have found that, there is a display device having a camera function and a communication function, and the display device is provided with a camera in a peripheral region on the light exit side thereof. When two users use such display devices for video communication, each of the users will unconsciously watch the information displayed on the display device instead of watching the camera provided in the peripheral region. Therefore, the effect of looking at each other by the two communicating users cannot be achieved.

Figure 1:
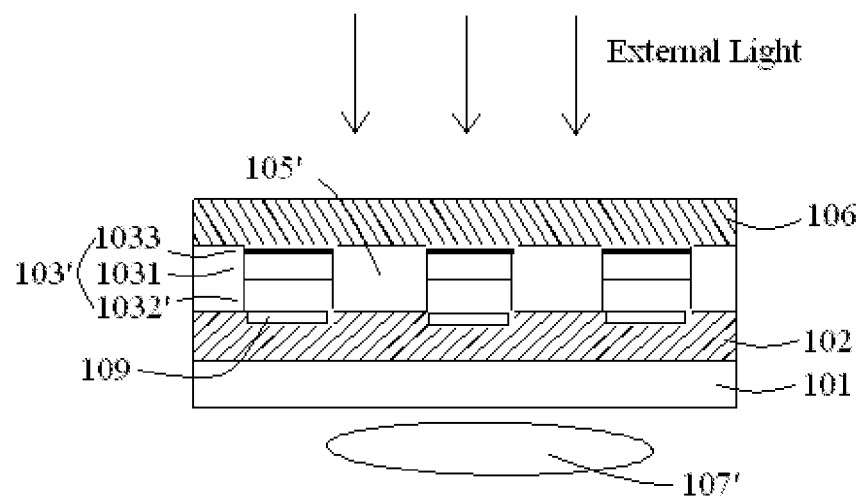
FIG. 1 is a schematic diagram showing structures of a display substrate, a display panel including the display substrate, and a display device including the display panel according to an embodiment of the present disclosure.

An embodiment of the present disclosure provides a display substrate (reference may be made to the reference sign "DS" shown in FIG. 2), a display panel (reference may be made to the reference sign "DP" shown in FIG. 2) including the display substrate, and a display device including the display panel, and the structures thereof are schematically shown in FIG. 1. The display substrate may include a base substrate 101, a driving layer 102 on the base substrate 101, and a light emitting element layer on the driving layer 102. The light emitting element layer may include a plurality of light emitting elements 103' and a pixel defining layer 105', and the pixel defining layer 105' may include a plurality of portions, each of the plurality of portions of the pixel defining layer 105' being located between adjacent two of the plurality of light emitting elements 103'. Each of the plurality of light emitting elements 103' may include an anode 1032', a light emitting function layer 1031, and a cathode 1033 which are sequentially provided on the driving layer 102. The anode 1032' may be made of a transparent conductive material such as indium tin oxide (ITO). The light emitting function layer 1031 may include an organic light emitting layer. The cathode 1033 may include indium zinc oxide (IZO), magnesium (Mg), or silver (Ag).

The display panel shown in FIG. 1 includes the above display substrate and a package structure 106. The package structure 106 is located on a side of the display substrate distal to the base substrate 101, to package the display substrate.

The display device shown in FIG. 1 includes the above display panel and a camera 107'. As shown in FIG. 1, the camera 107' is provided on the back side (i.e., the side opposite to the light exit side or the lower side shown in FIG. 1) of the display panel. With such a configuration, when two users perform video communication with each other using such display devices, each of the two users watch the information displayed on the display device, which is equivalent to watching the camera 107' provided on the back side of the display panel at the same time. Therefore, the effect of looking at each other by the two communicating users is achieved.

As described above, in the embodiment of FIG. 1, the pixel defining layer 105' is transparent (i.e., is made of a transparent material), and light emitted by two adjacent pixel units (i.e., adjacent two of the light emitting elements 103') will also pass through the pixel defining layer 105' and arrive at the camera 107'. Thus, the light collected by the camera 107' includes not only light (which includes external light and light from the display device) reflected by the user located in front of the display device (i.e., on the light exit side or the upper side of FIG. 1), but also light emitted from the light-emitting elements (i.e., the pixel units) 103', which may interfere with each other to cause the image captured by the display device to be distorted.

Figure 2:
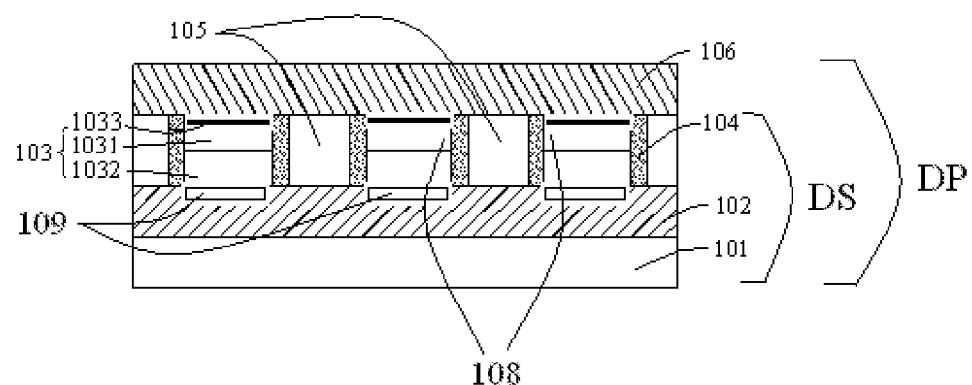
FIG. 2 is a schematic diagram showing structures of a display substrate and a display panel including the display substrate according to an embodiment of the present disclosure.

Another embodiment of the present disclosure provides a display substrate DS and a display panel DP including the display substrate DS, as shown in FIG. 2. The display substrate DS may include a base substrate 101 and a light emitting element layer, and the light emitting element layer is provided on a side (e.g., an upper side, as shown in FIG. 2) of the base substrate 101. The light emitting element layer may include a pixel defining layer and a plurality of light emitting elements 103. The pixel defining layer includes a plurality of pixel openings 108, a plurality of light transmission holes 105, and a plurality of opaque (i.e., lightproof) light shields 104. The plurality of light emitting elements 103 are provided in the plurality of pixel openings 108, respectively (i.e., the plurality of light emitting elements 103 are in one-to-one correspondence with the plurality of pixel openings 108), and each of the plurality of light transmission holes 105 penetrates through the pixel defining layer in a thickness direction (i.e., the vertical direction in FIG. 2) of the pixel defining layer. Portions (i.e., the light shields 104) of the pixel defining layer not provided with the pixel openings 108 or the light transmission holes 105 are lightproof, and a portion of the display substrate overlapping each of the plurality of light transmission holes 105 in the thickness direction is light transmissive (e.g., transparent). Each of the plurality of light transmission holes 105 is provided between adjacent two of the plurality of light emitting elements (i.e., pixel units) 103.

The display substrate DS may be packaged by using a package structure 106 such that the package structure 106 is located at a side (i.e., the upper side in FIG. 2) of the display substrate distal to the base substrate 101, so as to obtain the display panel DP. For example, the package structure 106 may be made of a light transmissive material. In an embodiment, the light transmissive material may include a silicon-containing inorganic material, a resin, or the like. As described above, the pixel defining layer includes the plurality of pixel openings 108 which are provided with an interval therebetween. Thus, the pixel defining layer includes a spacer (i.e., a portion of a pixel defining material layer) between adjacent two of the pixel openings 108. The spacer is made of an opaque material, and one of the light transmission holes 105 is formed in the spacer. In one aspect, each of the light transmission holes 105 is for increasing a light transmittance of the display panel DP including the display substrate DS. In another aspect, one of the opaque light shields 104 is formed between each of the light transmission holes 105 and an adjacent one of the light emitting elements 103. With such a configuration, adjacent two of the light shields 104 define one of the pixel openings 108 in which one of the light emitting elements 103 is located. Each of the plurality of light emitting elements 103 may include an anode 1032, a light emitting function layer 1031, and a cathode 1033 which are sequentially provided on a driving layer 102. Further, in an embodiment, each anode 1032 may be a reflective anode, and may be configured to reflect light emitted from the light emitting function layer 1031 towards a direction away from the driving layer 102. For example, each anode 1032 may have a multilayer structure of ITO/Ag/ITO. Alternatively, each anode 1032 may have a single layer structure made of a black conductive material. As such, a light reflectance of each anode 1032 on light emitted from a corresponding light emitting function layer 1031 may be greater than 90%. Further, the base substrate 101 may be made of a transparent material (e.g., glass, a resin, or the like). As a result, light emitted from each of the light emitting elements 103 can only exit from a light emitting side (i.e., the upper side in FIG. 2) of the display panel DP, light propagating in other directions is blocked by the light shields 104, causing the light emitted from the light emitting elements 103 to exit from the light emitting side of the display substrate DS only.

Therefore, in a case where the display panel DP including the display substrate DS is applied to a video communication device, a camera may be provided on a side (i.e., the back side or lower side in FIG. 2) of the display panel DP opposite to the light emitting side. Since a portion of the display panel DP overlapping each of the light transmission holes 105 in the thickness direction is light transmissive, light reflected by a user located on a light emitting side of the display panel DP can pass through the light transmission holes 105 of the display panel DP to arrive at the camera, such that the camera can capture an image of the user.

It should be noted that, as described above, since in the display substrate DS, one of the opaque light shields 104 is formed between each of the light transmission holes 105 and each of the light emitting elements 103, the light emitted from the light emitting element 103 in each of the pixel units cannot travel to the camera, and thus will not have any influence on the image of the user captured by the camera. As a result, the display substrate DS or the display panel DP can ensure the image not to be distorted while ensuring the effect of video communication.

In an embodiment, each of the light emitting elements 103 may be an organic light emitting diode (OLED). In this case, each of the light emitting elements 103 may further include a cathode 1033 at a side of a corresponding light emitting function layer 1031 distal to the corresponding anode 1032. Each cathode 1033 may be made of a transparent conductive material, such as indium zinc oxide (IZO), a combination of Mg and Ag (a ratio of one to the other may be adjusted to increase a light transmittance of the cathode 1033), or the like. Each light emitting function layer 1031 may include an organic light emitting layer, or may include a hole injection layer, a hole transport layer, an organic light emitting layer, an electron transport layer, and an electron injection layer sequentially provided on the corresponding anode 1032. According to a driving mode, OLEDs may be classified as active matrix OLEDs (AMOLEDs) and passive matrix OLEDs (PMOLEDs). In the case of an AMOLED, the display substrate DS may further include the driving layer 102 provided between the base substrate 101 and the light emitting element layer, as shown in FIG. 2. The driving layer 102 may include a plurality of pixel circuits (e.g., thin film transistors, which may be briefly referred to as TFTs) 109, and each of the pixel circuits 109 may correspond to one of the light emitting elements 103. The driving layer 102 may further include a transparent dielectric layer, and a plurality of TFTs and metal traces formed on the transparent dielectric layer. The metal traces may not overlap any one of the light transmission holes 105 in the thickness direction (i.e., the vertical direction in FIG. 2). As such, a portion of the driving layer 102 corresponding to each of the light transmission holes 105 is light transmissive. In the case of a PMOLED, the driving layer 102 shown in FIG. 2 may be omitted, and the anode 1032 and the cathode 1033 of each of the light emitting elements 103 may be connected to external switches, respectively, such that the light emitting element 103 is driven to operate.

As described above, in the case of the AMOLED, each of the light emitting elements 103 is provided with a corresponding pixel circuit, and the pixel circuit is configured to drive and control the light emitting element 103 to emit light according to a scan signal provided by a corresponding gate line and a data signal provided by a corresponding data line. In an embodiment, each of the pixel circuits 109 may be one of the thin film transistors (TFTs), and the thin film transistor includes a gate connected to the gate line, a source connected to the data line, and a drain connected to a corresponding anode 1032. However, the present disclosure is not limited thereto. For example, each of the pixel circuits 109 may be a transistor of any other type.

In an embodiment, in the light emitting element layer, a ratio of an area of all of the light emitting elements 103 to a total area of the light emitting element layer may range from 20% to 30%, and each of the light shields 104 has a small size in a direction (e.g., the horizontal direction in FIG. 2) perpendicular to the thickness direction of the display substrate DS. Thus, the most region of the light emitting element layer is light transmissive.

Further, an area of each pixel circuit 109 corresponding to each of the light emitting elements 103 is small, for example, is less than or equal to an area of an orthographic projection of the corresponding light emitting element 103 on the driving layer 102. Thus, the driving layer 102 including a dielectric layer made of a transparent material is light transmissive because most regions of the driving layer 102 are not provided with the pixel circuits 109 therein.

Figure 3:
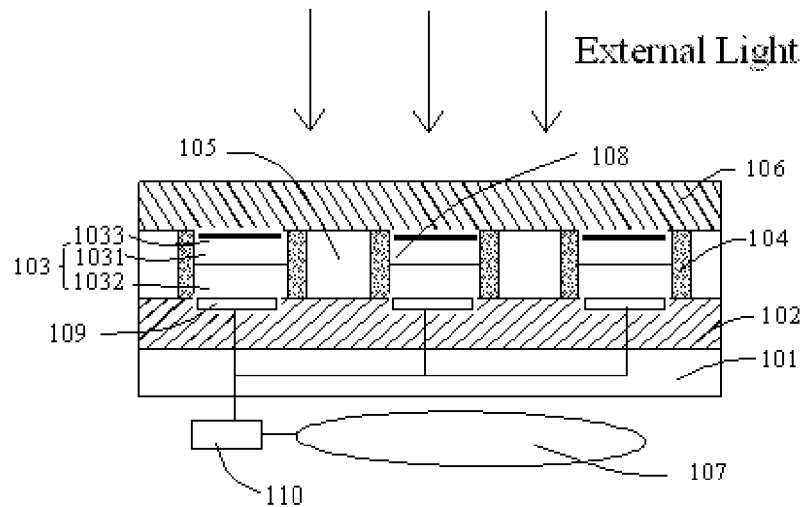
FIG. 3 is a schematic diagram showing a structure of a display device according to an embodiment of the present disclosure.

As described above, a portion of the driving layer 102 overlapping each of the light transmission holes 105 in the thickness direction of the display substrate DS is light transmissive, and thus light propagating from the light emitting side of the display panel DP including the display substrate DS to the display panel DP (e.g., light propagating in the direction as shown by the arrows in FIGS. 1 and 3) can pass through the plurality of light transmission holes and the driving layer 102 to arrive at a side of the display panel DP distal to the light emitting side.

It should be noted that, by taking FIG. 2 as an example, the light emitting side or the light exit side of the display panel DP is the side (i.e., the upper side in FIG. 2) of each of the light emitting elements 103 distal to the base substrate 101.

In an embodiment, the pixel defining layer (i.e., each of the light shields 104) is made of a material including a polymer and a colored dye. For example, the polymer may include at least one of polyimide and acrylic. Since polyimide or acrylic itself is a light transmissive material, a colored dye may be added into the polymer to cause the pixel defining layer (i.e., each of the light shields 104) to be lightproof (or opaque). In an embodiment, the colored dye may be a black dye such as carbon black. Since carbon black may absorb light in all frequency bands, adding carbon black into the polymer causes the polymer to become black and lightproof. The pixel defining layer (i.e., each of the light shields 104) made of the black and lightproof polymer can absorb light irradiating thereon, thereby achieving the opaque (i.e., light non-transmissive) effect.

As another aspect, an embodiment of the present disclosure provides the display panel DP, as shown in FIG. 2. The display panel DP may include the package structure 106 and the display substrate DS, and the package structure 106 is located at a side of the display substrate DS distal to the base substrate 101 to package the display substrate DS.

In the embodiment as shown in FIG. 2, the package structure 106 is provided on the side of the light emitting element layer distal to the driving layer 102.

As described above, the package structure 106 is provided on the top of the light emitting element layer to package the light emitting element layer, so as to form the display panel DP.

In an embodiment, other packaging layers may be provided between the package structure 106 and the light emitting element layer. For example, the other packaging layers may include a passivation layer, a planarization layer, and/or the like. The passivation layer may be configured to prevent the light emitting elements 103 from being oxidized or corroded, and the planarization layer is for decreasing defects occurring in the package structure 106.

As another aspect, an embodiment of the present disclosure provides a display device, as shown in FIG. 3. The display device may include a photosensitive unit 107 and a display panel. For example, the display panel is the display panel DP (as shown in FIG. 2) according to the above embodiment of the present disclosure. The photosensitive unit 107 is provided at the back side (i.e., the lower side in FIG. 3) of the base substrate 101, such that light propagating from the light emitting side of the display panel DP to the display panel DP (e.g., light propagating in a direction as shown by the arrows in FIG. 3) passes through the plurality of light transmission holes 105 to arrive at the photosensitive unit 107.

By taking FIG. 3 as an example, a side on which the package structure 106 is provided is the light emitting side of the display panel DP, and a side opposite to the light emitting side is the back side of the display panel DP.

It should be noted that, since the display panel DP includes the light emitting element layer, and the light emitting element layer includes the light transmission holes 105 and the lightproof light shields 104, light propagating from the light emitting side of the display panel DP to the display panel DP and passing through the light transmission holes 105 to arrive at the photosensitive unit 107 will not be influenced by light emitted from the light emitting elements 103.

The arrows shown in FIG. 3 may denote external light propagating from the outside to a light emitting surface of the display panel DP.

In an embodiment, the display device may further include an imaging unit (e.g., a CCD image sensor, a CMOS sensor, or the like) 110, and the photosensitive unit 107 may include a camera. The imaging unit 110 may form an image according to the information captured by the camera, and transmit the image to the display device for displaying.

As described above, in the present embodiment, the display device may be a video communication device including the display panel DP according to the embodiment of the present disclosure, and the camera is located within the display panel DP relative to the user on the light exit side of the display panel DP, and is located a side of the base substrate 101 distal to the driving layer 102. During a video communication between a first user and a second user, the first user can directly view the display device, and light reflected by the face of the first user passes through the light transmission holes 105 to arrive at the camera. The camera collects the light information reflected by the face of the first user and sends it to the imaging unit 110, and the imaging unit 110 forms an image based on the received information and provides the image to the display device. In this way, the display device can display the image of the face of the first user.

Further, the camera may send the captured information of the face of the first user to a back end server through a network, such that the back end server may send the information of the face of the first user to the second user in the video communication, and the image of the face of the first user may be displayed on a display device of the second user.

If the second user in the video communication also employs the display device according to the embodiment of the present disclosure, the camera of the display device of the second user also has the above function. That is, the information of the face of the second user may be sent to the back end server, such that the back end server may send the information of the face of the second user to the first user in the video communication, and the image of the face of the second user may be displayed on the display device of the first user.

During the video communication, since one of the light shields 104 is formed between each light transmission hole 105 and its adjacent light emitting element 103 of the display panel of the display device, light emitted from the light emitting element 103 in each of the pixel units will not propagate to the camera and will not have any influence on the image information captured by the camera. Thus, the display device can ensure the image not to be distorted while ensuring the effect of video communication.

Figure 4:
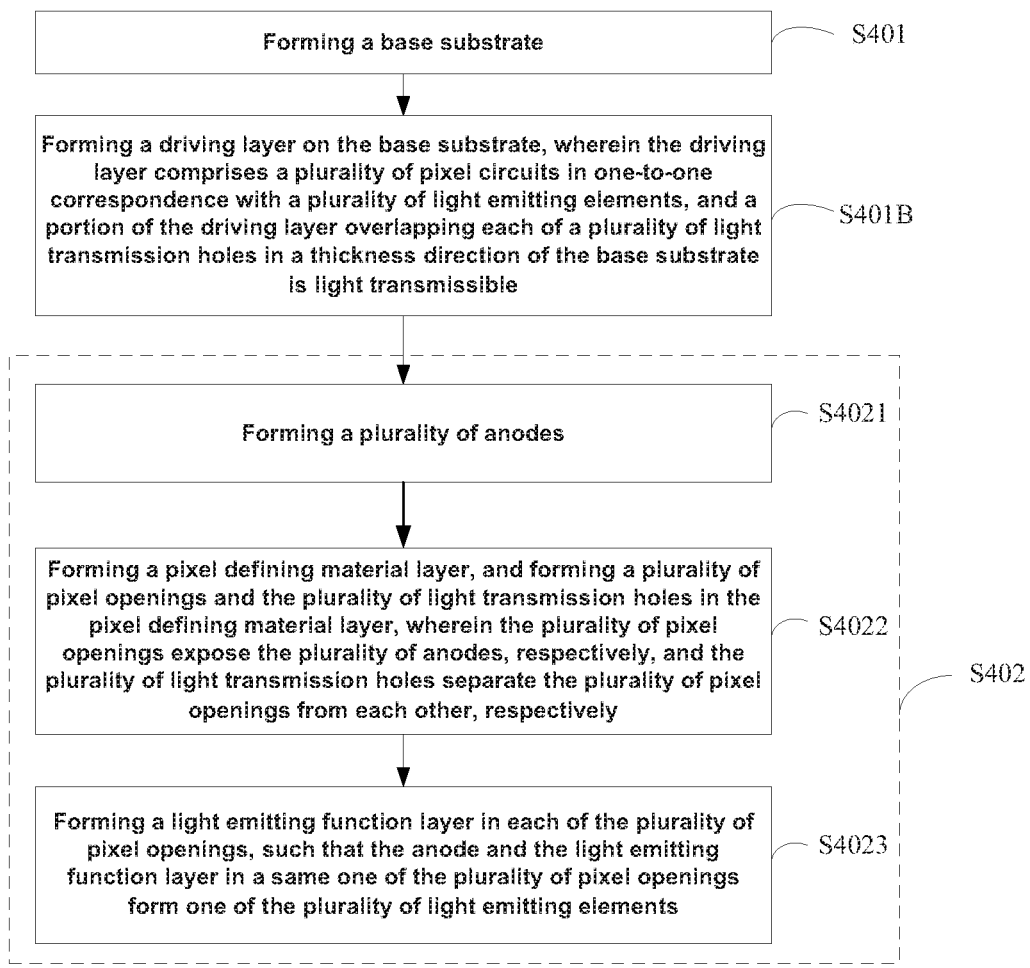
FIG. 4 is a schematic flowchart showing a method for manufacturing a display substrate according to an embodiment of the present disclosure.

As another aspect, an embodiment of the present disclosure provides a method for manufacturing the display substrate, as shown in FIG. 4. The method may include the following steps S401 to S402.

At step S401, the base substrate 101 is formed. For example, the base substrate 101 may be formed by using a transparent material such as glass, a resin, or the like.

At step S402, the light emitting element layer is formed on the base substrate 101. The light emitting element layer includes the pixel defining layer and the plurality of light emitting elements 103. The pixel defining layer includes the plurality of pixel openings 108 and the plurality of light transmission holes 105. The plurality of light emitting elements 103 are provided in the plurality of pixel openings 108, respectively. Each of the plurality of light transmission holes 105 penetrates through the pixel defining layer in the thickness direction of the pixel defining layer. Portions of the pixel defining layer not provided with the plurality of pixel openings 108 or the plurality of light transmission holes 105 are the opaque light shields 104, and a portion of the display substrate DS overlapping each of the plurality of light transmission holes 105 in the thickness direction is light transmissive.

As described above, the method including the step S401 and the step S402 may be employed to manufacture the display substrate DS according to the foregoing embodiment of the present disclosure. The structure, the operating principle, and the advantageous effects of the display substrate DS have been described above, and are omitted here.

In an embodiment, the step S402 may include the following steps S4021 to S4023.

Figure 5:
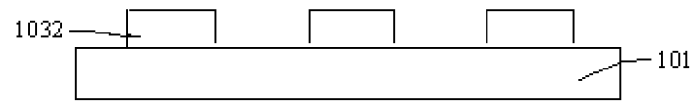
FIGS. 5 to 8 are schematic diagrams showing structures at stages of a method for manufacturing a display substrate according to an embodiment of the present disclosure.

At step S4021, the plurality of anodes 1032 are formed on the base substrate 101, as shown in FIG. 5. For example, each of the anodes 1032 may have the structure and material as described above.

For example, at the step S4021, the step of forming the plurality of anodes 1032 may include steps of: forming an anode material layer on the base substrate 101, and patterning the anode material layer to obtain the plurality of anodes 1032.

At step S4022, a pixel defining material layer is formed on the base substrate 101 and the plurality of anodes 1032, and then is patterned to form the pixel defining layer such that the pixel defining layer includes the plurality of pixel openings 108 and the plurality of light transmission holes 105, each of the plurality of light transmission holes 105 penetrates through the pixel defining layer in the thickness direction of the pixel defining layer, and the portions of the pixel defining layer not provided with the plurality of pixel openings 108 or the plurality of light transmission holes 105 are the opaque light shields 104.

In embodiments of the present disclosure, the step S4022 may be performed in many ways. For example, the pixel defining layer may be formed by a lithography process, or may be formed by a transfer printing process.

Figure 6:
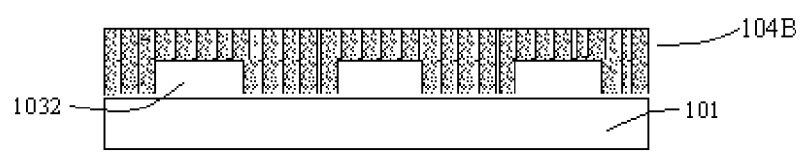
Figure 7:
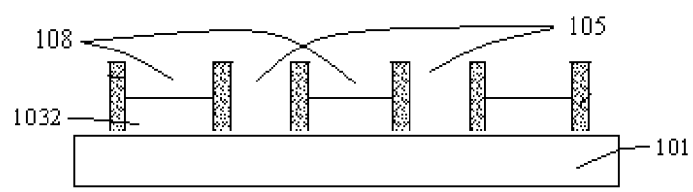

In a case where the pixel defining layer is formed by the lithography process, the step S4022 may include steps that a pixel defining material layer 104B is formed by using an opaque material (as shown in FIG. 6) such that the pixel defining material layer 104B may include a polymer and a colored dye; and the pixel defining material layer 104B is patterned to form the plurality of pixel openings 108 which expose the plurality of anodes 1032, respectively, and the plurality of light transmission holes 105 which separate the plurality of pixel openings 108 from each other, respectively, in the pixel defining material layer 104B (as shown in FIG. 7), so as to obtain the pixel defining layer. For example, the polymer may include polyimide and/or an acrylic material. The colored dye may be a black dye such as carbon black.

As described above, the pixel defining material layer 104B may include the colored dye in addition to polyimide or the acrylic material. Since the pixel defining layer is intended to be opaque, the colored dye may be the black dye (e.g., carbon black) in an embodiment. Since polyimide or acrylic itself is photosensitive, the pixel defining layer made of polyimide or acrylic may subject to the lithography process without an additional photomask, thereby simplifying the manufacturing thereof.

At step S4023, one of the light emitting function layers 1031 is formed in each of the plurality of pixel openings 108, such that the anode 1032 and the light emitting function layer 1031 in a same one of the pixel openings 108 form one of the plurality of light emitting elements 103.

It should be noted that, each light emitting function layer 1031 formed in the step S4023 in the embodiment of the present disclosure may have various structures. For example, as described above, each light emitting function layer 1031 may be an organic light emitting layer. Alternatively, each light emitting function layer 1031 may include a plurality of sub-layers, which may include a hole injection layer, a hole transport layer, a light emitting layer (e.g., an organic light emitting layer), an electron transport layer, and an electron injection layer sequentially stacked in a corresponding one of the pixel openings 108 from the bottom to the top of the pixel opening 108. In this way, each of the light emitting function layers 1031 and the corresponding anode 1032 in a respective one of the pixel openings 108 form one of the light emitting elements 103.

In an embodiment of the present disclosure, the base substrate 101 may be made of a light transmissive material. As an example, the light transmissive material may include glass, a resin, or the like.

As described above, the display substrate DS may further include the driving layer 102. In this case, the method may further include, between the step S401 and the step S402, the following step S401B.

Figure 8:
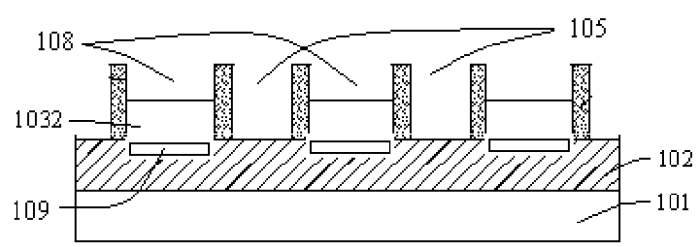

At step S401B, the driving layer 102 is formed on the base substrate 101 such that the driving layer 102 includes the plurality of pixel circuits 109 in one-to-one correspondence with the plurality of light emitting elements, and a portion of the driving layer 102 overlapping each of the light transmission holes 105 in the thickness direction is light transmissive, as shown in FIG. 8.

As described above, each of the pixel circuits 109 may be configured to drive the corresponding light emitting element 103 to emit light. Each of the pixel circuits 109 may include a thin film transistor (TFT).

As described above, in a display substrate DS manufactured by the method according to the embodiment of the present disclosure, the pixel defining layer includes the plurality of pixel openings 108 which are provided with an interval therebetween, and one light transmission hole 105 is provided between adjacent two of the pixel openings 108. Since the pixel defining layer is made of an opaque material, each of the light transmission holes 105 has at least the following functions. In one aspect, each light transmission hole 105 is for increasing a light transmittance of the display panel DP including the display substrate DS. In another aspect, each light transmission hole 105 and its adjacent light emitting element 103 are provided with one of the light shields 104 therebetween, such that each light emitting element 103 is provided within each pixel opening 108 between adjacent two of the light shields 104, causing light emitted from the light emitting element 103 to exit from the light emitting side of the display panel DP only, and light emitted therefrom and propagating in other directions to be blocked by the adjacent two of the light shields 104 and the reflective anode 1032. Thus, the light emitted from each light emitting element 103 cannot propagate to the other side of the display panel DP than the light emitting side. Further, the display panel DP may be applied to a video communication device, which can ensure the image not to be distorted while ensuring the effect of video communication. The operating principle of the video communication device has been described above, and is omitted here.

As another aspect, an embodiment of the present disclosure provides a method for manufacturing the display panel. The method may include steps of: manufacturing the display substrate DS by using the method for manufacturing a display substrate, according to any one of the above embodiments of the present disclosure; and packaging the display substrate DS with the package structure 106, to obtain the display panel DP, as shown in FIG. 2.

Thus, the display panel DP according to the present embodiment may be manufactured by packaging the display substrate DS according to any one of the above embodiments of the present disclosure.

As described above, to ensure an image of an object (e.g., a user) captured by the display panel DP not to be distorted, a portion of the display panel DP overlapping each of the light transmission holes 105 in the thickness direction is light transmissive. For example, the package structure 106 may be made of a light transmissive material. In an embodiment, the light transmissive material may include a silicon-containing inorganic material, a resin, or the like.

It should be noted that, the foregoing embodiments of the present disclosure may be combined with each other without explicit conflict.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display substrate, comprising
a base substrate; and
a light emitting element layer, which is on a side of the base substrate, and comprises a pixel defining layer and a plurality of light emitting elements,
wherein the pixel defining layer comprises a plurality of pixel openings and a plurality of light transmission holes, the plurality of light emitting elements are in the plurality of pixel openings, respectively, each of the plurality of light emitting elements comprises an anode, a light emitting function layer, and a cathode which are sequentially provided on the base substrate, at least a portion of the pixel defining layer is on a side of the cathode proximal to the base substrate in a direction perpendicular to the base substrate, each of the plurality of light transmission holes penetrates through the pixel defining layer in a thickness direction of the pixel defining layer, portions of the pixel defining layer not provided with the plurality of pixel openings or the plurality of light transmission holes are opaque light shields, and a portion of the display substrate overlapping each of the plurality of light transmission holes in the thickness direction is light transmissive.

2. The display substrate according to claim 1, further comprising a driving layer between the base substrate and the light emitting element layer, wherein the driving layer comprises a plurality of pixel circuits in one-to-one correspondence with the plurality of light emitting elements, and a portion of the driving layer overlapping each of the plurality of light transmission holes in the thickness direction is light transmissive.

3. The display substrate according to claim 1, wherein each of the light shields of the pixel defining layer is made of a material comprising a polymer and a colored dye.

4. The display substrate according to claim 3, wherein the polymer comprises at least one of polyimide and acrylic.

5. The display substrate according to claim 3, wherein the colored dye comprises a black dye.

6. The display substrate according to claim 5, wherein the black dye comprises carbon black.

7. The display substrate according to claim 2, wherein each of the plurality of pixel circuits comprises a thin film transistor.

8. The display substrate according to claim 2, wherein the anode is between the light emitting function layer and the driving layer.

9. The display substrate according to claim 8, wherein the anode is a reflective anode, and is configured to reflect light emitted from the light emitting function layer towards a direction away from the driving layer.

10. The display substrate according to claim 9, wherein the anode has a multilayer structure of ITO/Ag/ITO.

11. The display substrate according to claim 1, wherein the base substrate is made of a transparent material.

12. The display substrate according to claim 11, wherein the base substrate is made of at least one of glass and a resin.

13. A display panel, comprising
a display substrate; and
a package structure,
wherein the display substrate is the display substrate according to claim 1, and
the package structure is on a side of the display substrate distal to the base substrate, to package the display substrate.

14. A display device, comprising
a photosensitive unit; and a display panel,
wherein the display panel is the display panel according to claim 13, and
the photosensitive unit is on a side of the base substrate distal to the light emitting element layer, such that light propagating from a light emitting side of the display panel to the display panel passes through the plurality of light transmission holes to arrive at the photosensitive unit.

15. A method for manufacturing a display substrate, comprising steps of
forming a base substrate; and
forming a light emitting element layer on the base substrate, wherein the light emitting element layer comprises a pixel defining layer and a plurality of light emitting elements,
wherein the pixel defining layer comprises a plurality of pixel openings and a plurality of light transmission holes, the plurality of light emitting elements are provided in the plurality of pixel openings, respectively, each of the plurality of light transmission holes penetrates through the pixel defining layer in a thickness direction of the pixel defining layer, portions of the pixel defining layer not provided with the plurality of pixel openings or the plurality of light transmission holes are opaque light shields, and a portion of the display substrate overlapping each of the plurality of light transmission holes in the thickness direction is light transmissive; and
wherein the step of forming a light emitting element layer comprises steps of
forming a plurality of anodes on the base substrate;
forming a pixel defining material layer on the base substrate and the plurality of anodes;
forming the plurality of pixel openings and the plurality of light transmission holes in the pixel defining material layer, wherein the plurality of pixel openings expose the plurality of anodes, respectively, and the plurality of light transmission holes separate the plurality of pixel openings from each other, respectively; and
forming a light emitting function layer in each of the plurality of pixel openings, such that the anode and the light emitting function layer in a same one of the plurality of pixel openings form one of the plurality of light emitting elements.

16. A method for manufacturing a display substrate, comprising steps of
forming a base substrate; and
forming a light emitting element layer on the base substrate, wherein the light emitting element layer comprises a pixel defining layer and a plurality of light emitting elements,
wherein the pixel defining layer comprises a plurality of pixel openings and a plurality of light transmission holes, the plurality of light emitting elements are provided in the plurality of pixel openings, respectively, each of the plurality of light transmission holes penetrates through the pixel defining layer in a thickness direction of the pixel defining layer, portions of the pixel defining layer not provided with the plurality of pixel openings or the plurality of light transmission holes are opaque light shields, and a portion of the display substrate overlapping each of the plurality of light transmission holes in the thickness direction is light transmissive; and
the method further comprising, between the step of forming a base substrate and the step of forming a light emitting element layer, a step of
forming a driving layer on the base substrate, wherein the driving layer comprises a plurality of pixel circuits in one-to-one correspondence with the plurality of light emitting elements, and a portion of the driving layer overlapping each of the plurality of light transmission holes in the thickness direction is light transmissive.

17. The method according to claim 15, wherein the step of forming a pixel defining material layer comprises steps of
forming the pixel defining material layer by using an opaque material, wherein the opaque material comprises a polymer and a colored dye, and the polymer comprises at least one of polyimide and acrylic; and
patterning the pixel defining material layer, to form the pixel defining layer.

18. The method according to claim 17, wherein carbon black is employed as the colored dye.

19. A method for manufacturing a display panel, comprising steps of
manufacturing a display substrate by using the method according to claim 15; and
packaging the display substrate by using a package structure, wherein the package structure is provided on a side of the display substrate distal to the base substrate.

20. A method for manufacturing a display panel, comprising steps of
manufacturing a display substrate by using the method according to claim 16; and
packaging the display substrate by using a package structure, wherein the package structure is provided on a side of the display substrate distal to the base substrate.

* * * * *